United States Patent
Nishio

(10) Patent No.: US 12,336,093 B2
(45) Date of Patent: Jun. 17, 2025

(54) MULTILAYER BOARD AND METHOD OF MANUFACTURING THE SAME

(71) Applicant: Murata Manufacturing Co., Ltd., Nagaokakyo (JP)

(72) Inventor: Kosuke Nishio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 167 days.

(21) Appl. No.: 17/979,032

(22) Filed: Nov. 2, 2022

(65) Prior Publication Data
US 2023/0053211 A1 Feb. 16, 2023

Related U.S. Application Data

(63) Continuation of application No. PCT/JP2021/021109, filed on Jun. 3, 2021.

(51) Int. Cl.
*H05K 1/02* (2006.01)
*H05K 1/16* (2006.01)
*H05K 3/46* (2006.01)

(52) U.S. Cl.
CPC ........... *H05K 1/0298* (2013.01); *H05K 1/162* (2013.01); *H05K 3/4652* (2013.01); *H05K 2201/0129* (2013.01)

(58) Field of Classification Search
CPC .... H05K 1/0298; H05K 1/162; H05K 3/4652; H05K 2201/0129; H05K 2201/0141;
(Continued)

(56) References Cited

U.S. PATENT DOCUMENTS

| | | | |
|---|---|---|---|
| 2002/0132898 A1* | 9/2002 | Takaya | H01B 3/442 524/543 |
| 2003/0090883 A1* | 5/2003 | Asahi | H01L 25/16 257/E21.705 |

(Continued)

FOREIGN PATENT DOCUMENTS

| | | |
|---|---|---|
| JP | 2002026520 A | 1/2002 |
| JP | 2005251949 A | 9/2005 |

(Continued)

OTHER PUBLICATIONS

CGM Findings, "Metal Melting Points_A guide to melting metals" https://userblogs.ganoksin.com/cgmfindings/2012/10/03/metal-melting-points-guide-to-melting-metals/ Oct. 3, 2012 visited on Nov. 20, 2024 (Year: 2012).*

(Continued)

*Primary Examiner* — Timothy J Thompson
*Assistant Examiner* — Paramita Ghosh
(74) *Attorney, Agent, or Firm* — Keating & Bennett, LLP

(57) ABSTRACT

A multilayer board includes thermoplastic resin layers laminated together, a first-class conductor pattern including a conductor foil on a first surface of one of the thermoplastic resin layers, a second-class conductor pattern in contact with a second surface of the one of the thermoplastic resin layers, and an interlayer connection conductor in the one of the thermoplastic resin layers and including a first end surface connected to the first-class conductor pattern and a second end surface connected to a second-class conductor pattern. The second-class conductor pattern and the first interlayer connection conductor include a conductor of a single material including a resin, or a conductor of a single material including a metal with a melting point lower than that of the conductor foil.

13 Claims, 20 Drawing Sheets

(58) Field of Classification Search
CPC ..... H05K 2201/015; H05K 2201/0154; H05K 1/092; H05K 1/165; H05K 1/167; H05K 3/46; H05K 3/00
See application file for complete search history.

(56) References Cited

U.S. PATENT DOCUMENTS

| | | | |
|---|---|---|---|
| 2005/0045379 A1* | 3/2005 | Sakurai | H05K 3/1258 |
| | | | 257/702 |
| 2012/0205145 A1 | 8/2012 | Sakai | |
| 2021/0367351 A1* | 11/2021 | Ohkoshi | H05K 1/0222 |
| 2022/0279663 A1* | 9/2022 | Mun | H05K 1/036 |

FOREIGN PATENT DOCUMENTS

| | | |
|---|---|---|
| JP | 5024484 B2 | 9/2012 |
| JP | 2016213416 A | 12/2016 |
| WO | 2012108381 A1 | 8/2012 |

OTHER PUBLICATIONS

International Search Report in PCT/JP2021/021109, mailed Aug. 10, 2021, 3 pages.
Written Opinion in PCT/JP2021/021109, mailed Aug. 10, 2021, 4 pages.

* cited by examiner

Fig. 3A
Fig. 3B
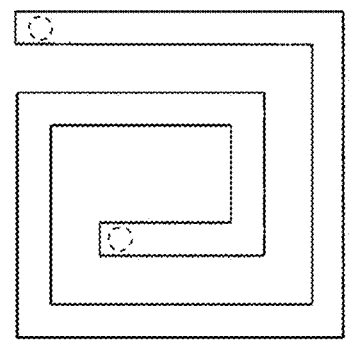
Fig. 3C
Fig. 3D
Fig. 3E
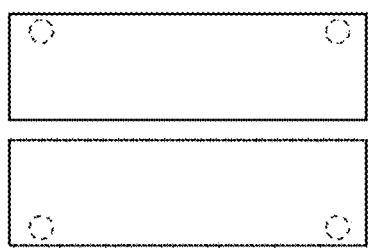

MULTILAYER BOARD AND METHOD OF MANUFACTURING THE SAME

CROSS REFERENCE TO RELATED APPLICATIONS

This application claims the benefit of priority to Japanese Patent Application No. 2020-096562 filed on Jun. 3, 2020 and is a Continuation application of PCT Application No. PCT/JP2021/021109 filed on Jun. 3, 2021. The entire contents of each application are hereby incorporated herein by reference.

BACKGROUND OF THE INVENTION

1. Field of the Invention

The present invention relates to a multilayer board including a plurality of layers and a method of manufacturing the multiplayer board.

2. Description of the Related Art

Japanese Patent No. 5024484 discloses an example of a conventional multilayer board. This multilayer board includes a plurality of thermoplastic resin layers, conductor patterns formed on the thermoplastic resin layers, and interlayer conductor portions that pass through the thermoplastic resin layers and connect the conductor patterns to each other. In addition, the multilayer board is manufactured by the following process. That is, the conductor pattern is formed on one side of each resin film. Furthermore, through-holes which pass through the resin films and through which the conductor patterns are exposed are formed, and the through-holes are filled with a metal paste. The resin films are laminated together. Then, the resin films are thermally pressure-bonded by application of heat and pressure, and interlayer conductor portions are formed by curing or low-temperature sintering of the conductive paste.

In the multilayer board disclosed in Japanese Patent No. 5024484, the conductor patterns formed in different layers are connected to each other by interlayer conductor portions. The connection reliability between the conductor patterns and the interlayer conductor portions needs to be further increased in the multilayer board as described above.

SUMMARY OF THE INVENTION

Preferred embodiments of the present invention provide multilayer boards in each of which a connection reliability between conductor patterns and interlayer connection conductors is improved, and also provide methods of manufacturing the multilayer boards.

According a preferred embodiment of the present invention, a multilayer board includes a plurality of thermoplastic resin layers including a first thermoplastic resin layer and a second thermoplastic resin layer and laminated together, a first-class conductor pattern including a conductor foil on a first surface of the first thermoplastic resin layer, a second-class conductor pattern in contact with a second surface of the first thermoplastic resin layer, and a first interlayer connection conductor in the first thermoplastic resin layer and including a first end surface connected to the first-class conductor pattern and a second end surface connected to a second-class conductor pattern, in which the second thermoplastic resin layer is in contact with the second surface of the first thermoplastic resin layer, the second-class conductor pattern and the first interlayer connection conductor include a conductor of a single material including a resin or a conductor of a single material including a metal with a melting point lower than that of the conductor foil, and one surface of the second-class conductor pattern is in contact with the second surface of the first thermoplastic resin layer.

According to another preferred embodiment of the present invention, a method of manufacturing a multilayer board including a plurality of thermoplastic resin layers, includes forming a conductor foil on a first surface of a first thermoplastic resin layer of a plurality of thermoplastic resin layers, and forming a hole to extend through the first thermoplastic resin layer from a second surface of the first thermoplastic resin layer to the conductor foil, filling the hole with a conductor including a resin or a conductor including a metal with a melting point lower than that of the conductor foil and forming a conductive pattern on the second surface of the first thermoplastic resin layer with the conductor, and thermally pressure-bonding the plurality of thermoplastic resin layers together.

According to preferred embodiments of the present invention, it is possible to obtain multilayer boards in each of which the connection reliability between the conductor patterns and the interlayer connection conductors has been improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a plan view of a second-class conductor pattern 14. FIGS. 3B to 3E are plan views illustrating other examples of the second-class conductor pattern formed on the multilayer board 10.

DETAILED DESCRIPTION OF THE PREFERRED EMBODIMENTS

A plurality of preferred embodiments of the present invention will be described below. These preferred embodiments are examples, and the structures according to the preferred embodiments may be partially replaced or combined. The differences between preferred embodiments of the present invention and that described previously will be described. In particular, the same operations and effects obtained by the same structures will not be described for each of the preferred embodiments.

First Preferred Embodiment

Figure 1:
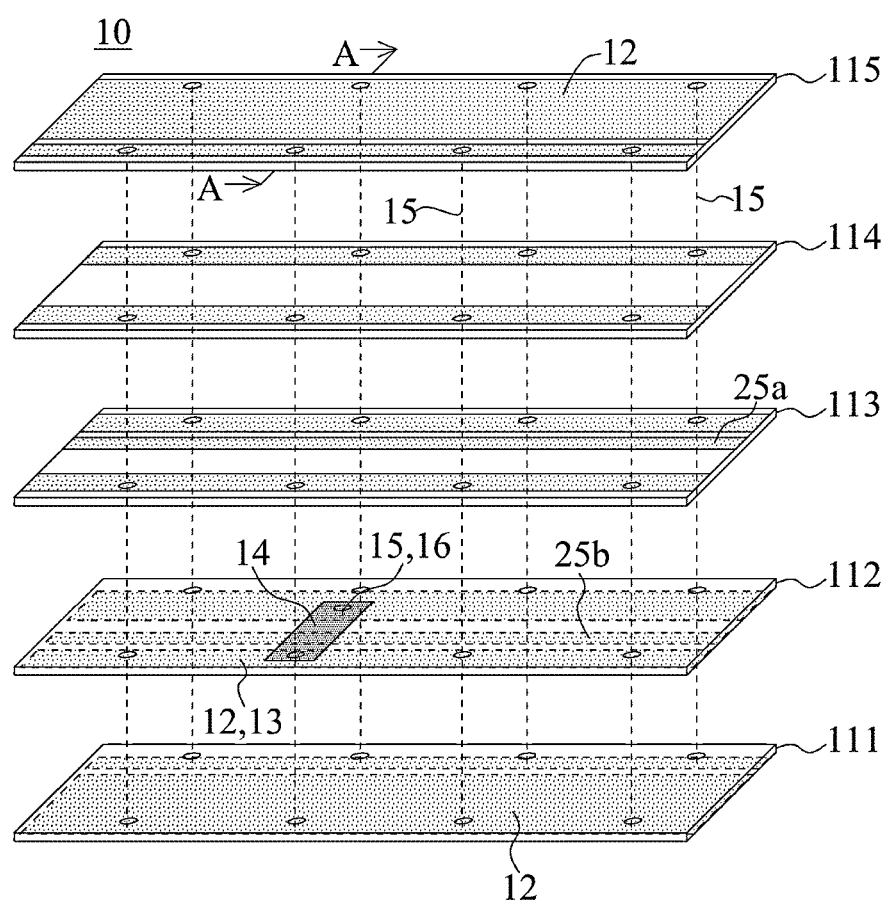
FIG. 1 is an exploded perspective view of a portion of a multilayer board 10 according to a first preferred embodiment of the present invention.
Figure 2:
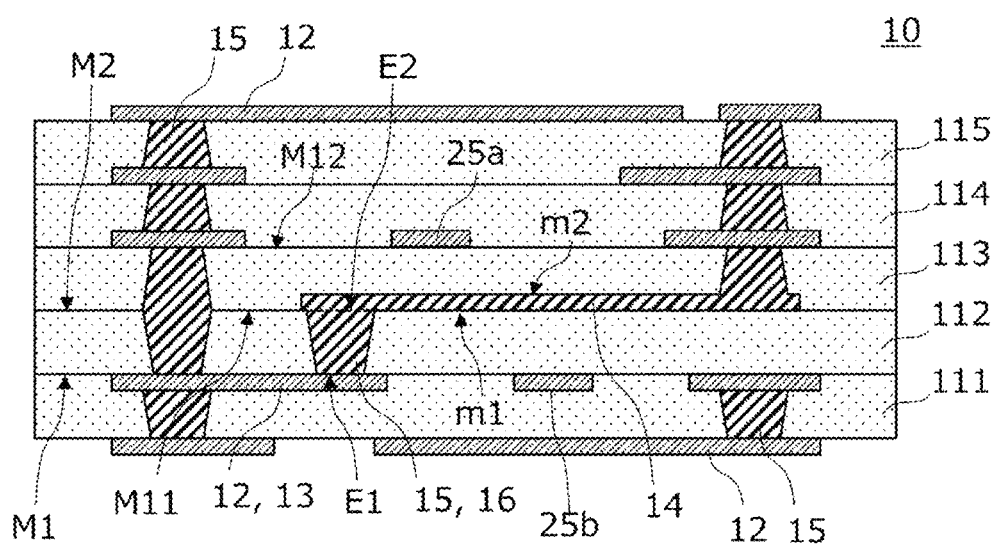
FIG. 2 is a sectional view of the multilayer board 10 according to the first preferred embodiment of the present invention.

FIG. 1 is an exploded perspective view of a portion of a multilayer board 10 according to a first preferred embodiment. FIG. 2 is a sectional view of the multilayer board 10 according to the first preferred embodiment. The multilayer board 10 is a signal transmission line as illustrated in FIG. 1. The multilayer board 10 is formed by laminating a plurality of thermoplastic resin layers 111, 112, 113, 114, and 115 including the thermoplastic resin layer 112 (first thermoplastic resin layer) and the thermoplastic resin layer 113 (second thermoplastic resin layer) together. The multilayer board 10 includes the plurality of laminated thermoplastic resin layers 111, 112, 113, 114, and 115, first-class conductor patterns 12, a second-class conductor pattern 14, and interlayer connection conductors 15. The thermoplastic resin layer 112 is an example of the first thermoplastic resin layer. The thermoplastic resin layer 113 is an example of the second thermoplastic resin layer. The thermoplastic resin layer 113 is in contact with the other surface of the thermoplastic resin layer 112 (second main surface M2). The first-class conductor patterns 12 are formed of a conductor foil. The second-class conductor pattern 14 and the interlayer connection conductors 15 are formed of a conductive member of a single material including a resin. The first-class conductor pattern 12 includes a first-class conductor pattern 13 formed on one surface (first main surface M1) of the thermoplastic resin layer 112. The interlayer connection conductors 15 include an interlayer connection conductor 16 formed in the thermoplastic resin layer 112. The interlayer connection conductor 16 is an example of the first interlayer connection conductor. One surface (first main surface m1) of the second-class conductor pattern 14 is disposed in contact with the other surface (second main surface M2) of the thermoplastic resin layer 112. The interlayer connection conductor 16 has one end surface (first end surface E1) connected to the first-class conductor pattern 13 and the other end surface (second end surface E2) connected to the second-class conductor pattern 14. The area of the second end surface E2 of the interlayer connection conductor 16 is larger than the area of the first end surface E1 of the interlayer connection conductor 16. A conductor pattern formed of a conductor foil is not present between the other surface (second main surface m2) of the second-class conductor pattern 14 and one surface (first main surface M11) of the thermoplastic resin layer 113.

The thermoplastic resin layers 111 to 115 are laminated together in this order and directly bonded together by application of heat and pressure. The thermoplastic resin layers 111 to 115 are formed of a material including a thermoplastic resin such as a liquid crystal polymer (LCP) resin, a polyetheretherketone (PEEK) resin, a polyetherimide (PEI) resin, a polyimide (PI) resin, a fluorine resin, or other thermoplastic resins.

The first-class conductor patterns 12 are disposed on the main surfaces of the thermoplastic resin layers 111 to 115. The first-class conductor pattern 12 is not formed on the second main surface M2 of the thermoplastic resin layer 112 and is thus not formed between the thermoplastic resin layer 112 and the thermoplastic resin layer 113. The first-class conductor pattern 12 formed on the other surface of the thermoplastic resin layer 113 is a signal conductor layer 25a through which a high-frequency signal is transmitted. The first-class conductor pattern 12 formed on one surface of the thermoplastic resin layer 112 is a signal conductor layer 25b through which a high-frequency signal is transmitted. The other first-class conductor patterns 12 are connected to the ground potential. The first-class conductor patterns 12 are formed of a metal foil such as copper foil.

The interlayer connection conductors 15 are formed in the thermoplastic resin layers 111 to 115. Each of the interlayer connection conductors 15 passes through one of the thermoplastic resin layers 111 to 115. The interlayer connection conductors 15 have a tapered shape and are tapered in the lamination direction of the thermoplastic resin layers 111 to 115. The direction in which the interlayer connection conductors 15 disposed in the thermoplastic resin layer 111 and 112 are tapered is opposite to the direction in which the interlayer connection conductors 15 disposed in the thermoplastic resin layers 113 to 115 are tapered. The interlayer connection conductors 15 are formed by solidification of a conductive paste by application of heat and pressure. A material of the conductive paste is, for example, metal powder containing Sn, Ni, Cu, Ag, or an alloy thereof, a binder resin such as an epoxy resin, a solvent, and the like. As described above, the interlayer connection conductors 15 are formed of a conductive member containing a resin. Alternatively, the interlayer connection conductors 15 may be formed of a conductive member containing a metal having a melting point lower than that of the conductor foil. The conductive member as described above is, for example, solder. Solder contains Pb and Sn. However, the solder does not need to contain Pb.

The second-class conductor pattern 14 is disposed between the thermoplastic resin layer 112 and the thermoplastic resin layer 113. The second-class conductor pattern 14 is formed to cover a portion of the second main surface M2 of the thermoplastic resin layer 112. The area of the second-class conductor pattern 14 portion that does not overlap the interlayer connection conductor 16 in the lamination direction of the thermoplastic resin layers 111 to 115 is larger than the area of the second-class conductor pattern 14 portion that overlaps the interlayer connection conductor 16. Like the interlayer connection conductors 15, the second-class conductor pattern 14 is formed by solidification of a conductive paste by application of heat and pressure. The second-class conductor pattern 14 and the interlayer connection conductor 16 are continuous with each other and integrally formed by a single conductive member. Accordingly, the second-class conductor pattern 14 may be formed of a conductive member containing a metal having a melting point lower than that of the conductor foil.

The second conductor pattern 14 is connected to the ground potential.

The second-class conductor pattern 14 is thinner than the first-class conductor pattern 12 but may have the same thickness as the first-class conductor pattern 12 or may be thicker than the first-class conductor pattern 12.

FIG. 3A is a plan view of the second-class conductor pattern 14. FIGS. 3B to 3E are plan views illustrating other examples of the second-class conductor pattern formed on the multilayer board 10. In FIGS. 3A to 3E, the positions of the interlayer connection conductors connected to the second-class conductor pattern are indicated by dashed lines. As illustrated in FIGS. 2 and 3A, the second-class conductor pattern 14 is a conductor pattern for wiring that connects the interlayer connection conductors 15 to each other. However, as illustrated in FIGS. 3B to 3E, the second-class conductor pattern formed on the multilayer board 10 may be a spiral or coiled conductor pattern for an inductor, a meander conductor pattern for an inductor, or a planar conductor pattern for a capacitor that performs capacitance coupling with end surfaces.

Figure 4:
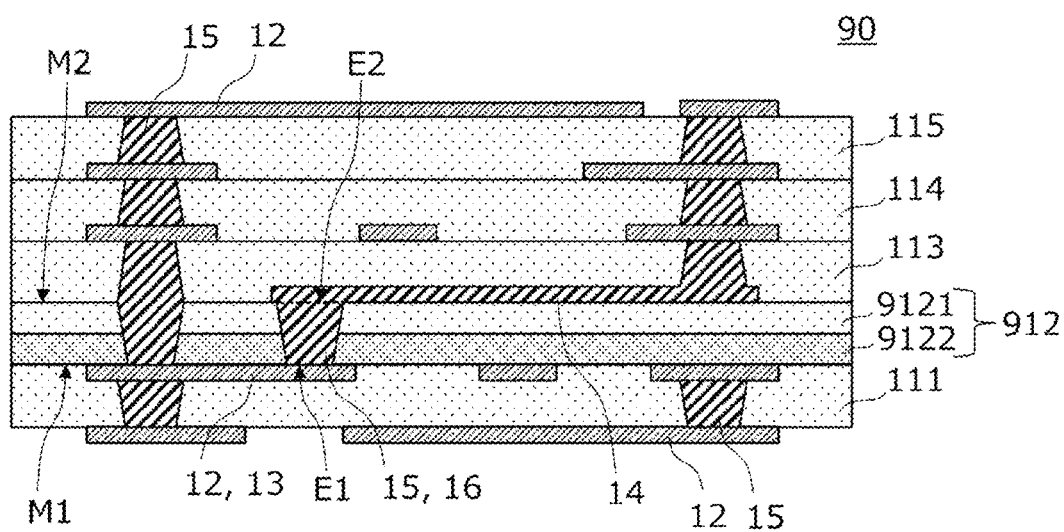
FIG. 4 is a sectional view of a multilayer board 90 according to a modification of the first preferred embodiment of the present invention.

FIG. 4 is a sectional view of a multilayer board 90 according to a modification of the first preferred embodiment. The multilayer board 90 differs from the multilayer board 10 in the following points. That is, the multilayer board 90 has a thermoplastic resin layer 912 instead of the thermoplastic resin layer 112. The thermoplastic resin layer 912 includes a plurality of layers including thermoplastic resin layers 9121 and 9122. For example, the thermoplastic resin layers 111, 113 to 115, and 9121 are LCP resin layers, and the thermoplastic resin layer 9122 is a fluororesin layer. As described above, a plurality of thermoplastic resin layers may be disposed between the first-class conductor pattern 13 and the second-class conductor pattern 14.

Figure 5A:
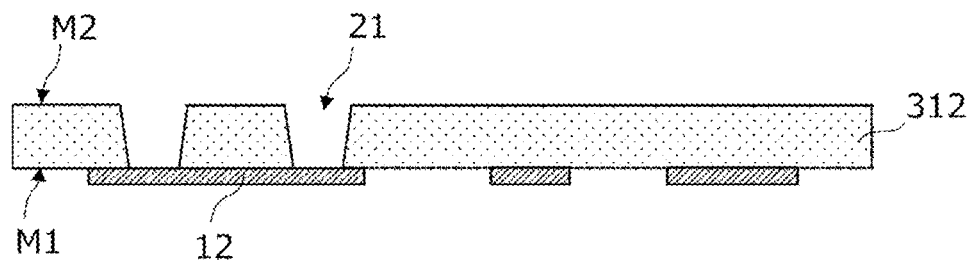
FIGS. 5A to 5C are sectional views illustrating a method of manufacturing the multilayer board 10 according to the first preferred embodiment of the present invention.
Figure 5B:
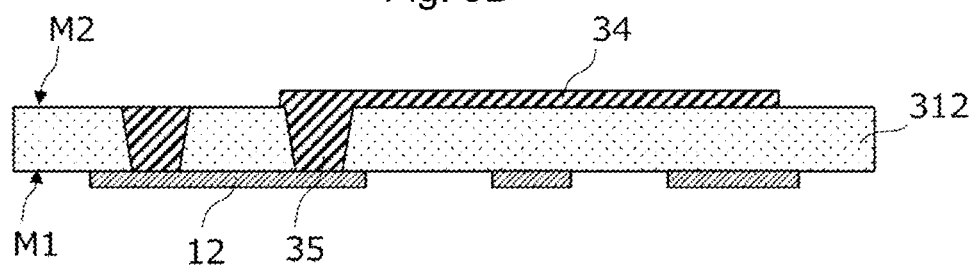
Figure 5C:
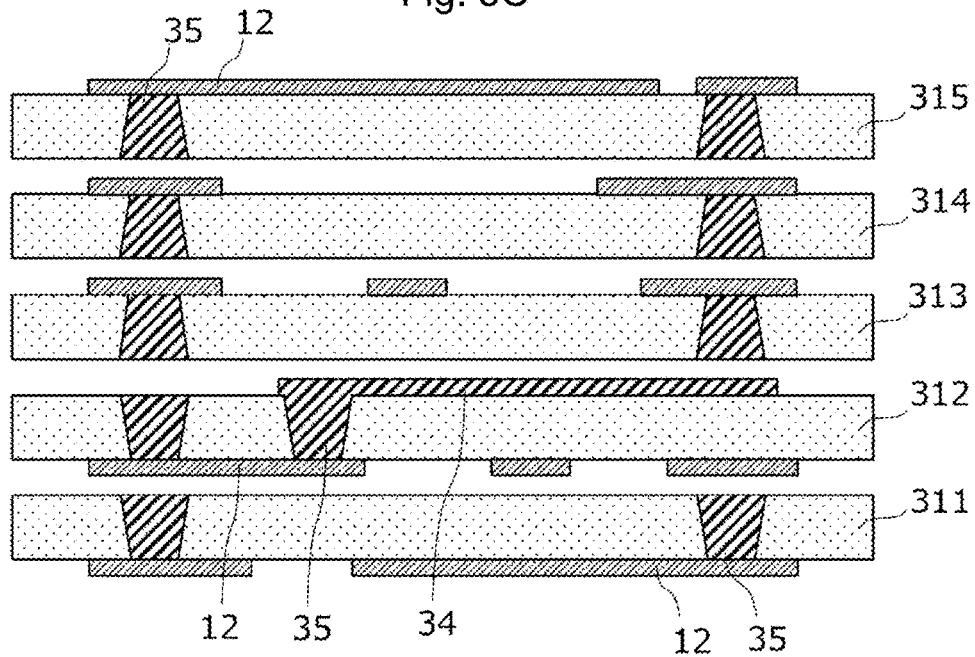

FIGS. 5A to 5C are sectional views illustrating a method of manufacturing the multilayer board 10 according to the first preferred embodiment.

First, as illustrated in FIG. 5A, conductor foil is formed on one surface (first main surface M1) of a resin sheet 312 formed of a thermoplastic resin. The first-class conductor patterns 12 are formed by, for example, patterning the conductor foil by using photolithography technology. In addition, a hole 21 passing through the resin sheet 312 from the other surface (second main surface M2) of the resin sheet 312 to the conductor foil is formed by, for example, laser machining. The hole 21 passes through the resin sheet 312 without passing through the first-class conductor pattern 12 to expose the first-class conductor pattern 12 from the bottom of the hole 21. Since the hole 21 is bored from the second main surface M2 of the resin sheet 312, the hole 21 is tapered toward the first main surface M1 from the second main surface M2 of the resin sheet 312.

It should be noted that the process of patterning the conductor foil may be performed before or after the process of forming the hole 21 or may be performed concurrently with the process of forming the hole 21.

Next, as illustrated in FIG. 5B, a conductive paste body 35 is formed by filling the hole 21 with the conductive paste, and a conductive paste body 34 is formed on the second main surface M2 of the resin sheet 312 by using the conductive paste. The conductive paste body 34 is an example of the conductive pattern. For example, the conductive paste bodies 34 and 35 are formed by printing or ejecting the conductive paste onto the second main surface M2 of the resin sheet 312. The conductive paste body 34 is continuous with at least one of the conductive paste bodies 35 and covers a portion of the second main surface M2 of the resin sheet 312. The conductive paste bodies 34 and 35 are formed of a single conductive paste.

It should be noted that the conductive paste body 34 is thinner than the first-class conductor pattern 12 but may have the same thickness as the first-class conductor pattern 12 or may be thicker than the first-class conductor pattern 12.

As illustrated in FIG. 5C, the first-class conductor patterns 12 and the conductive paste bodies 35 are formed on the resin sheets 311, 313, 314, and 315 by performing the process identical to the process described above concurrently with the process described above before or after the process described above.

It should be noted that the conductive paste body 34 may be formed on a resin sheet 313 instead of the resin sheet 312 to form the second-class conductor pattern 14 between the thermoplastic resin layer 112 and the thermoplastic resin layer 113.

The material of the resin sheets 313 to 315 is an LCP resin, a PEEK resin, a PEI resin, a PI resin, a fluorine resin, or another thermoplastic resin. The conductor foil is a metal foil, such as copper foil. The material of the conductive paste is, for example, metal powder containing Sn, Ni, Cu, Ag, an alloy thereof, a binder resin, such as an epoxy resin, a solvent, and the like. It should be noted that a metal body may be formed by use of a conductive member containing a metal having a melting point lower than that of the conductor foil instead of the conductive paste bodies 34 and 35. The conductive member containing a metal having a melting point lower than that of the conductor foil is, for example, solder.

Next, as illustrated in FIG. 5C, the resin sheets 311 to 315 are laminated together in this order with the main surfaces of the resin sheets 313 to 315 on which the first-class conductor patterns 12 have been formed facing away from the main surfaces of the resin sheets 311 and 312 on which the first-class conductor patterns 12 have been formed. More briefly, the resin sheets 311 to 315 are laminated together with the laminating orientation of the resin sheets 313 to 315 reversed with respect to the laminating orientation of the resin sheets 311 and 312.

Next, the resin sheets 311 to 315 are thermally pressure-bonded together by application of heat and pressure to the resin sheets 311 to 315, the second-class conductor pattern 14 is formed by solidification of the conductive paste body 34, and the interlayer connection conductors 15 are formed by solidification of the conductive paste body 35. As a result, the multilayer board 10 is obtained.

It should be noted that individual multilayer boards 10 may be manufactured by separating the collective board that forms the structure of a plurality of multilayer boards 10 into individual pieces.

In the first preferred embodiment, since the second-class conductor pattern 14 is formed of the conductive member of the same material as that of the interlayer connection conductor 16, the connection reliability between the conductor patterns and the interlayer connection conductors is improved.

In addition, when the multilayer board is manufactured by the method disclosed in the prior art described above, a conductor pattern cannot be easily formed at the location (referred to below as the reverse location) at which the resin sheets having lamination orientations opposite to each other are joined to each other.

For example, in a method of forming the conductor pattern at the reverse location, a conductor foil may be formed on one side of the resin sheet that defines the reverse location, and the conductor foil may then be patterned. However, in this method, the conductor foil needs to be pasted onto the resin sheet, and the conductor foil then needs to be patterned by using photolithography technology after the hole formed in the resin sheet is filled with the conductive paste. This complicates the manufacturing process and increases the number of processes.

In the first preferred embodiment, in the process of forming the interlayer connection conductors 15, the second-class conductor pattern 14 is formed of the same materials as those of the interlayer connection conductor 15. Therefore, the conductor pattern can be formed at the reverse location by reducing the complexity of the manufacturing process and preventing an increase in the number of processes.

As a result, it is possible to increase the number of layers of the conductor pattern without changing the number of thermoplastic resin layers, that is, to increase the wiring density of the multilayer board.

In other words, when the same circuit is formed in the conventional multilayer board and in the multilayer board according to the first preferred embodiment, the number of thermoplastic resin layers of the multilayer board according to the first preferred embodiment can be smaller than the number of thermoplastic resin layers of the conventional multilayer board.

In addition, in the first preferred embodiment, the second-class conductor pattern 14 is thinner than the first-class conductor pattern 12. This indicates that the conductive paste body 34 is formed thinner than the first-class conductor pattern 12. Therefore, in the process of applying heat and pressure to the resin sheets 311 to 315 laminated together, seepage or flow of the conductive paste body 34 is relatively reduced or prevented, and dimensional errors of the second-class conductor pattern 14 are relatively reduced or prevented.

In addition, in the first preferred embodiment, a conductive pattern that becomes the second-class conductor pattern is printed while the hole is filled with a conductive paste or a metal cream. The metal cream is, for example, a mixture of a metal and a liquid flux. This can form the interlayer connection conductor 16 and the second-class conductor pattern 14 at the same time. In addition, since the first-class conductor pattern is present on the bottom surface of the hole, the conductive paste or the metal cream is less likely to be removed. As a result, manufacturing of the multilayer board 10 becomes easier. In addition, the conductive paste or the metal cream in the hole and the conductive pattern are simultaneously solidified by application of heat. That is, the interlayer connection conductor 16 and the second-class conductor pattern 14 are formed at the same time, with the conductive paste or the metal cream in the hole being connected to the conductive pattern. As a result, the connection reliability between the interlayer connection conductor 16 and the second-class conductor pattern 14 is improved.

Second Preferred Embodiment

In the second preferred embodiment, the thermoplastic resin layer has a recess portion that accommodates the second-class conductor pattern.

Figure 6:
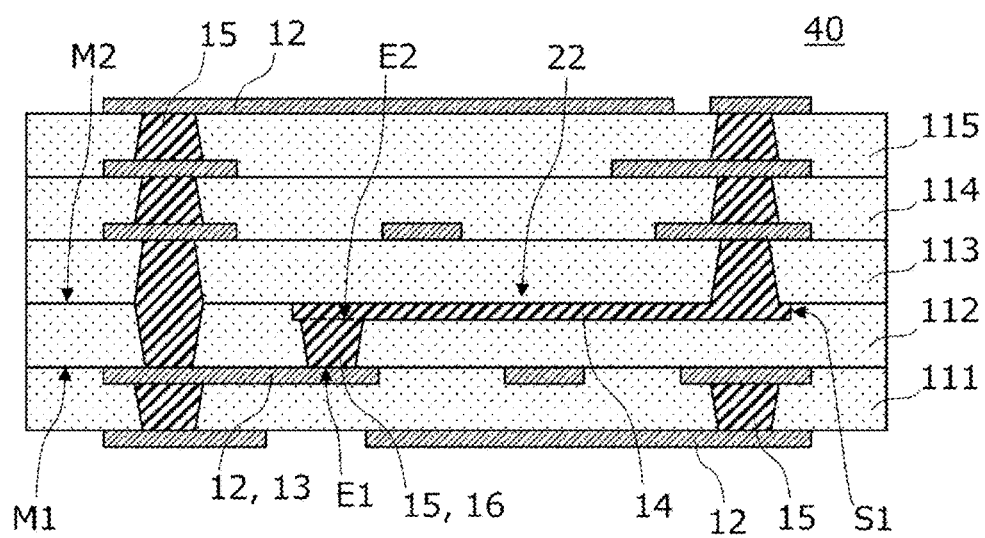
FIG. 6 is a sectional view of a multilayer board 40 according to a second preferred embodiment of the present invention.

FIG. 6 is a sectional view of a multilayer board 40 according to the second preferred embodiment. The multilayer board 40 differs from the multilayer board 10 (see FIG. 2) according to the first preferred embodiment in the following points. That is, the thermoplastic resin layer 112 of the multilayer board 40 has a recess portion (or a groove) 22. The recess portion 22 is formed in the second main surface M2 of the thermoplastic resin layer 112. The recess portion 22 is formed along the second-class conductor pattern 14 and accommodates the second-class conductor pattern 14. A side surface S1 of the second-class conductor pattern 14 is in contact with the thermoplastic resin layer 112.

It should be noted that the recess portion 22 that accommodates the second-class conductor pattern 14 may be formed in the main surface of the thermoplastic resin layer 113 in contact with the thermoplastic resin layer 112, instead of the second main surface M2 of the thermoplastic resin layer 112.

The roughness of the bottom surface and the side surface of the recess portion 22 differs from the roughness of a second main surface M2 portion of the thermoplastic resin layer 112 in which the recess portion is not formed. In particular, when the recess portion 22 is formed by laser machining as described later, the roughness of the bottom surface and the side surfaces of the recess portion 22 is larger than the roughness of the second main surface M2 portion of the thermoplastic resin layer 112 in which the recess portion is not formed. In the present application, the arithmetic mean roughness is used as an index of the roughness.

Figure 7A:
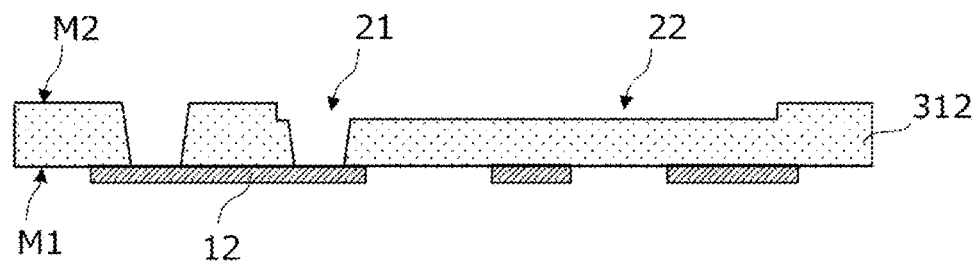
FIGS. 7A to 7C are sectional views illustrating a method of manufacturing the multilayer board 40 according to the second preferred embodiment of the present invention.
Figure 7B:
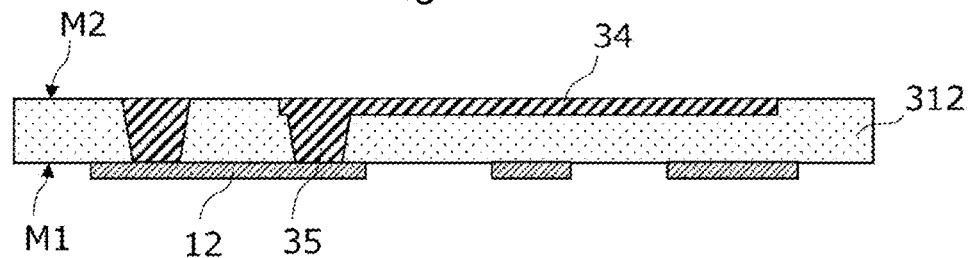
Figure 7C:
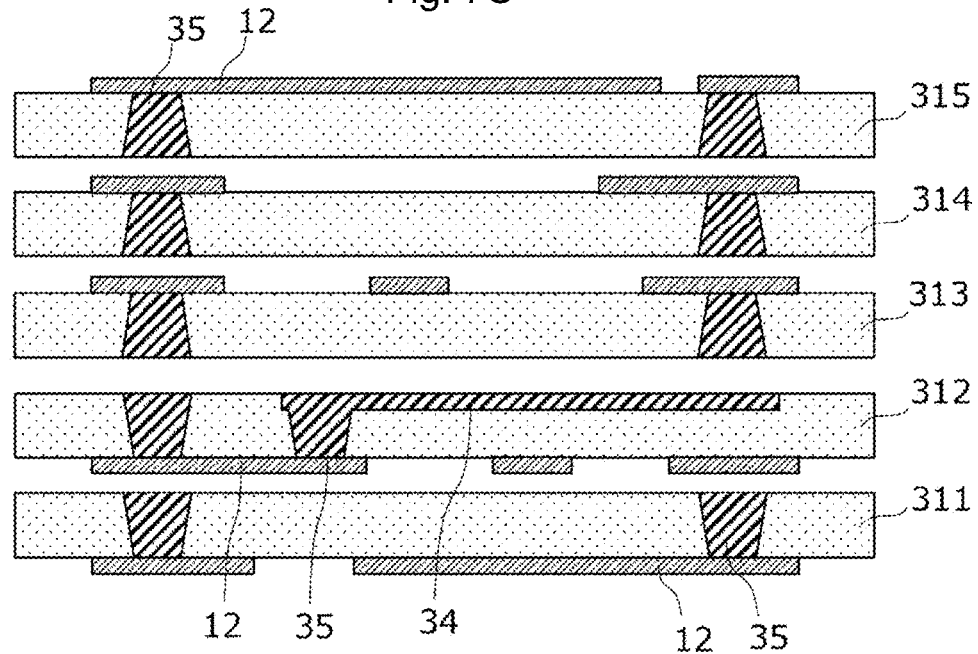

FIGS. 7A to 7C are sectional views illustrating a method of manufacturing the multilayer board 40 according to the second preferred embodiment.

First, as illustrated in FIG. 7A, the first-class conductor pattern 12 and hole 21 are formed on the resin sheet 312 by the process identical to that of the manufacturing method according to the first preferred embodiment. Furthermore, the recess portion 22 is formed in the second main surface M2 of the resin sheet 312. For example, the recess portion 22 is formed by etching, laser machining, or cutting.

Next, as illustrated in FIG. 7B, the conductive paste body 35 is formed by filling the hole 21 with the conductive paste, and the conductive paste body 34 is formed by filling the recess portion 22 with the conductive paste. For example, the conductive paste bodies 34 and 35 are formed by printing or ejecting the conductive paste onto the second main surface M2 of the resin sheet 312.

Next, as illustrated in FIG. 7C, the first-class conductor patterns 12 and the conductive paste bodies 35 are formed on the resin sheets 311 and 313 to 315 by the process identical to that of the manufacturing method according to the first preferred embodiment, the resin sheets 311 to 315 are laminated together, and heat and pressure are applied to the resin sheets 311 to 315. As a result, the multilayer board 40 is obtained.

In the second preferred embodiment, the second-class conductor pattern 14 is formed by filling the recess portion 22 of the resin sheet 312 with the conductive paste. Therefore, an inversion or a protrusion of the conductive paste is reduced or prevented in the heat and pressure application process. In particular, the larger the roughness of the bottom surface and the side surfaces of the recess portion 22, the higher the adhesiveness of the conductive paste. As a result, the dimensional error of the second-class conductor pattern 14 is reduced or prevented. In other words, the electrochemical migration of the second-class conductor pattern 14 is reduced or prevented.

Accordingly, an increase in the depth of the recess portion 22 can thicken the second-class conductor pattern 14 while reducing or preventing the dimensional error of the second-class conductor pattern 14.

Furthermore, conductor patterns for configuring devices that require predetermined characteristics, such as inductors and capacitors may be formed on the multilayer board. Such conductor patterns need to meet the strict standard of dimensional error. Therefore, it is particularly effective to form such conductor patterns by using the second-class conductor pattern accommodated in the recess portion.

Third Preferred Embodiment

In the third preferred embodiment, a wall portion surrounding the second-class conductor pattern is provided.

Figure 8:
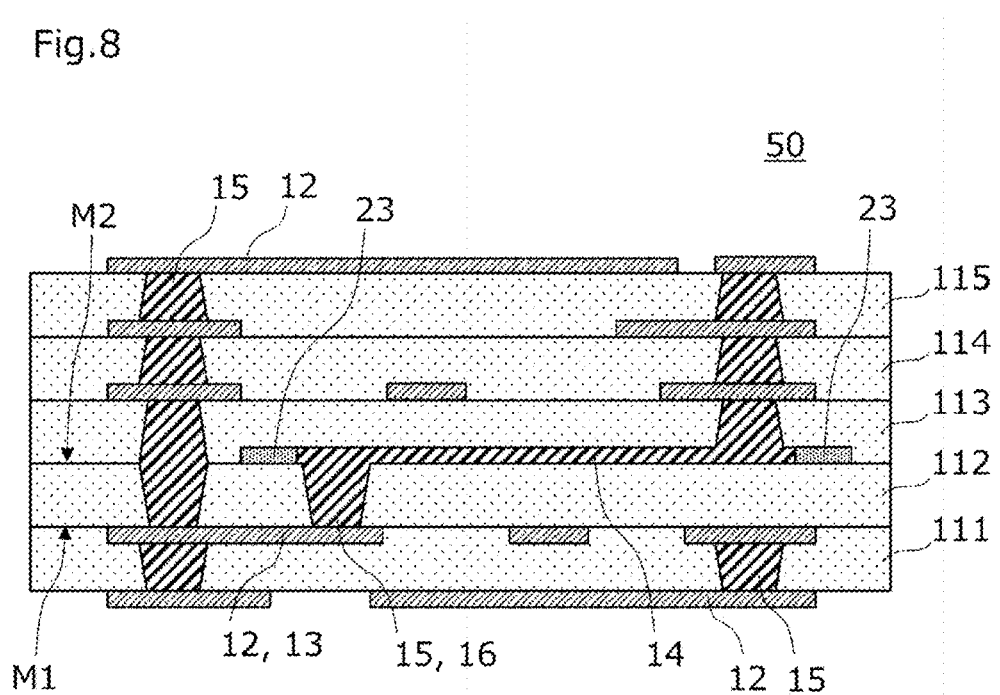
FIG. 8 is a sectional view of a multilayer board 50 according to a third preferred embodiment of the present invention.

FIG. 8 is a sectional view of a multilayer board 50 according to the third preferred embodiment. The multilayer board 50 differs from the multilayer board 10 (see FIG. 2) according to the first preferred embodiment in the following points. That is, the multilayer board 50 has a wall portion 23 formed on the second main surface M2 of the thermoplastic resin layer 112. The wall portion 23 surrounds the second-class conductor pattern 14 as seen in the lamination direction of the thermoplastic resin layers 111 to 115. The wall portion 23 does not extend to the end portions of the thermoplastic resin layers 111 to 115. In other words, the wall portion 23 is not exposed to the outside.

It should be noted that the wall portion 23 may extend to the end portions of the thermoplastic resin layers 111 to 115.

When the second-class conductor pattern 14 forms an inductor, the wall portion 23 may be formed of a magnetic material. Accordingly, since a magnetic material can be disposed inside the inductor by forming the wall portion 23, the inductance value increases.

Figure 9A:
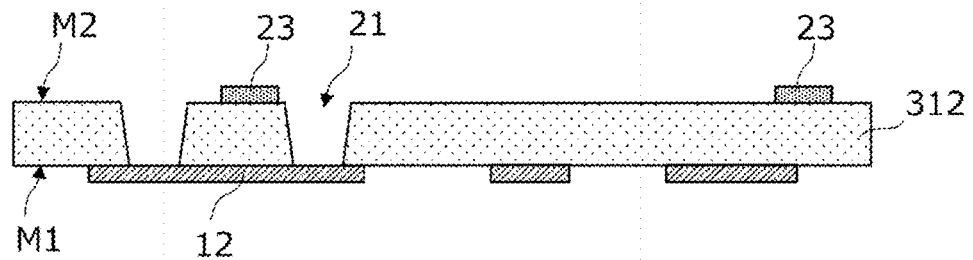
FIGS. 9A to 9C are sectional views illustrating a method of manufacturing the multilayer board 50 according to the third preferred embodiment of the present invention.
Figure 9B:
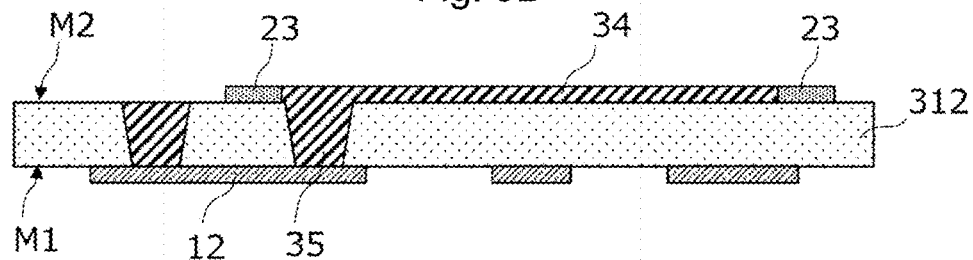
Figure 9C:
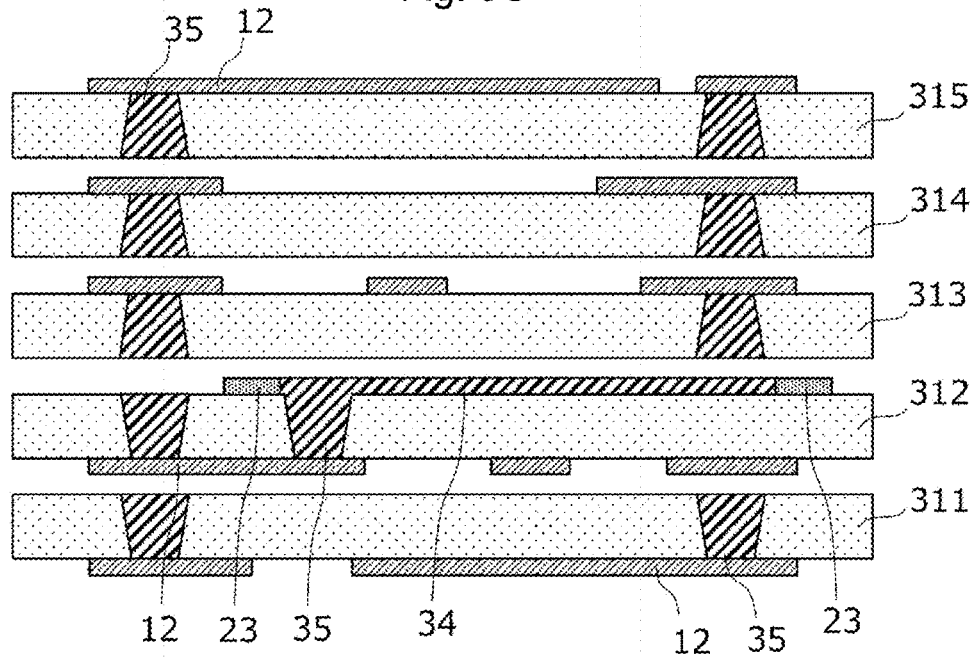

FIGS. 9A to 9C are sectional views illustrating a method of manufacturing the multilayer board 50 according to the third preferred embodiment.

First, as illustrated in FIG. 9A, the first-class conductor pattern 12 and the hole 21 are formed on the resin sheet 312 by the process identical to that of the manufacturing method according to the first preferred embodiment. Furthermore, the wall portion 23 is formed on the second main surface M2 of the resin sheet 312.

Next, as illustrated in FIG. 9B, the conductive paste body 35 is formed in the hole 21 and the conductive paste body 34 is formed in the space surrounded by the wall portion 23 by printing or ejecting the conductive paste onto the second main surface M2 of the resin sheet 312.

Next, as illustrated in FIG. 9C, the first-class conductor patterns 12 and the conductive paste bodies 35 are formed on the resin sheets 311 and 313 to 315 by the process identical to that of the manufacturing method according to the first preferred embodiment, the resin sheets 311 to 315 are laminated together, and heat and pressure are applied to the resin sheets 311 to 315. As a result, the multilayer board 50 is obtained.

In the third preferred embodiment, the second-class conductor pattern 14 is formed by filling the space surrounded by the wall portion 23 with the conductive paste. Therefore, the inversion or protrusion of the conductive paste is reduced or prevented in the heat and pressure application process, and the dimensional error of the second-class conductor pattern 14 is reduced or prevented.

In addition, the wall portion 23 does not extend to the end portions of the thermoplastic resin layers 111 to 115. Therefore, since the wall portion 23 is sandwiched between the resin sheet 312 and the resin sheet 313 in the heat and pressure application process, the wall portion 23 is less likely to be detached from the resin sheet 312.

Fourth Preferred Embodiment

In a first example of the fourth preferred embodiment, the second-class conductor pattern is used for bridge wiring to connect two signal conductors to each other. In a second example of the fourth preferred embodiment, the second-class conductor pattern is used for the electrode of the capacitor. In a third example of the fourth preferred embodiment, the second-class conductor pattern is used for a shield conductor that electromagnetically shield the signal conductor from each other.

Figure 10:
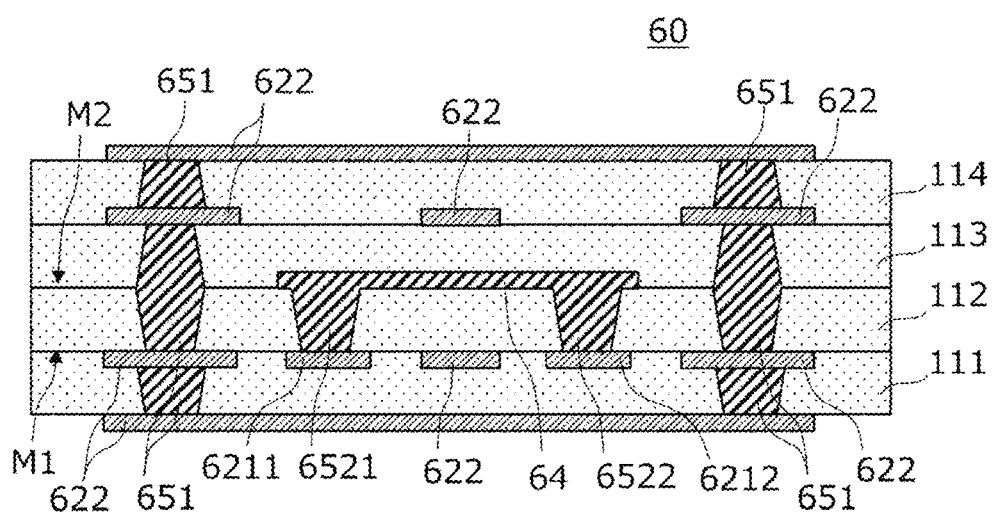
FIG. 10 is a sectional view of a multilayer board 60 according to a first example of a fourth preferred embodiment of the present invention.

FIG. 10 is a sectional view of a multilayer board 60 according to the first example of the fourth preferred embodiment. The multilayer board 60 includes the thermoplastic resin layers 111 to 114, first-class conductor patterns 6211, 6212, and 622, the second-class conductor pattern 64, and interlayer connection conductors 651, 6521, and 6522. These components define two striplines. The first-class conductor patterns 6211 and 6212 form the first and second signal conductors, respectively. The first-class conductor patterns 622 and the interlayer connection conductors 651 define a ground conductor. The second-class conductor pattern 64 and the interlayer connection conductors 6521 and 6522 define bridge wiring to connect the first signal conductor and the second signal conductor to each other. The interlayer connection conductors 6521 and 6522 are examples of the first interlayer connection conductor and the second interlayer connection conductor, respectively.

The resistivity of the first-class conductor pattern is smaller than the resistivity of the second-class conductor pattern. Therefore, the first-class conductor patterns are preferably used for the signal conductors.

The first-class conductor patterns 6211 and 6212 are formed on the first main surface M1 of the thermoplastic resin layer 112. The interlayer connection conductors 6521 and 6522 are formed on the thermoplastic resin layer 112 and connected to the first-class conductor patterns 6211 and 6212, respectively. The second-class conductor pattern 64 is formed in the second main surface M2 of the thermoplastic resin layer 112 and connects the interlayer connection conductor 6521 and the interlayer connection conductor 6522 to each other. The first-class conductor patterns 6211, 6212, and 622 are formed of a conductor foil, and the second-class conductor pattern 64 and the interlayer connection conductors 651, 6521, and 6522 are formed of a conductive member of a single material.

Figure 11:
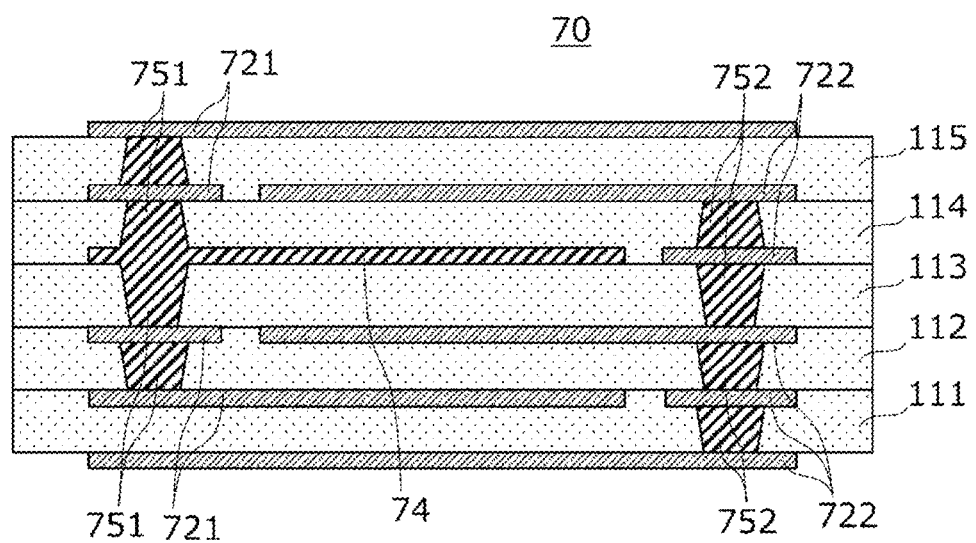
FIG. 11 is a sectional view of a multilayer board 70 according to a second example of the fourth preferred embodiment of the present invention.

FIG. 11 is a sectional view of a multilayer board 70 according to a second example of the fourth preferred embodiment. The multilayer board 70 includes the thermoplastic resin layers 111 to 115, first-class conductor patterns 721 and 722, a second-class conductor pattern 74, and interlayer connection conductors 751 and 752. These components define a capacitor. The first-class conductor pattern 721, the second-class conductor pattern 74, and the interlayer connection conductors 751 define one electrode of the capacitor. The first-class conductor patterns 722 and the interlayer connection conductors 752 define the other electrode of the capacitor. The first-class conductor patterns 721 and 722 are formed of a conductor foil, and the second-class conductor pattern 74 and the interlayer connection conductors 751 and 752 are formed of a conductive member of a single material.

Figure 12:
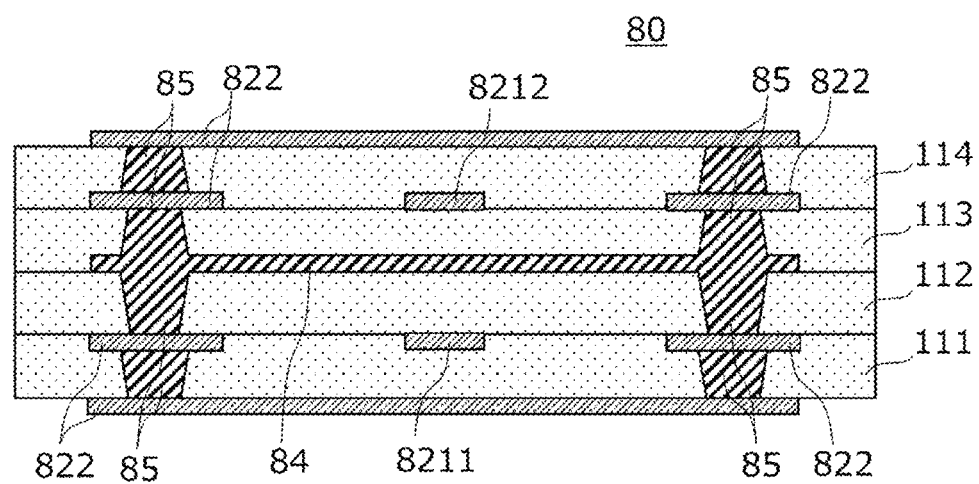
FIG. 12 is a sectional view of a multilayer board 80 according to a third example of the fourth preferred embodiment of the present invention.

FIG. 12 is a sectional view of a multilayer board 80 according to the third example of the fourth preferred embodiment. The multilayer board 80 includes the thermoplastic resin layers 111 to 114, first-class conductor patterns 8211, 8212, and 822, a second-class conductor pattern 84, and interlayer connection conductors 85. These components define two striplines. The first-class conductor patterns 8211 and 8212 define the first and second signal conductors, respectively. The first-class conductor patterns 822, the second-class conductor pattern 84, and the interlayer connection conductors 85 define the ground conductor. Furthermore, the second-class conductor pattern 84 is disposed between the first signal conductor and the second signal conductor in the lamination direction of the thermoplastic resin layers 111 to 114 and defines a shield conductor. The first-class conductor patterns 8211, 8212, and 822 are formed of a conductor foil, and the second-class conductor pattern 84 and the interlayer connection conductors 85 are formed by a conductive member of a single material.

Fifth Preferred Embodiment

Figure 13:
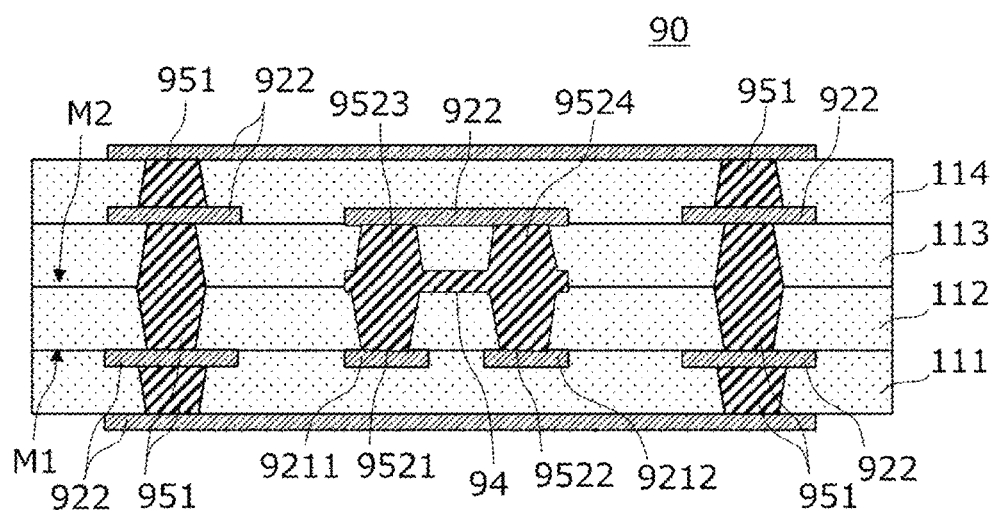
FIG. 13 is a sectional view of the multilayer board 90 according to a fifth preferred embodiment of the present invention.

In the fifth preferred embodiment, the multilayer board 90 further includes interlayer connection conductors 9523 and 9524. FIG. 13 is a sectional view of the multilayer board 90 according to the fifth preferred embodiment.

The interlayer connection conductors 9523 and 9524 pass through the thermoplastic resin layer 113. One ends of the interlayer connection conductors 9523 and 9524 are connected to the second-class conductor pattern 94. The other ends of the interlayer connection conductors 9523 and 9524 are connected to the first-class conductor patterns 922. The areas of one ends of the interlayer connection conductors 9523 and 9524 are larger than the areas of the other ends of the interlayer connection conductors 9523 and 9524.

In addition, an interlayer connection conductor 9521 and an interlayer connection conductor 9522 are adjacent to each other. More specifically, the interlayer connection conductor 9521 is closest to the interlayer connection conductor 9522 in a direction orthogonal in the lamination direction. The interlayer connection conductor 9523 and the interlayer connection conductor 9524 are adjacent to each other. More specifically, the interlayer connection conductor 9523 is closest to the interlayer connection conductor 9524 in a direction orthogonal in the lamination direction.

In the multilayer board 90 as described above, the conductive pattern formed in one surface of the thermoplastic resin layer 112 overlaps the conductive pattern formed on one main surface of the thermoplastic resin layer 113 to form the second-class conductor pattern 94.

In the multilayer board 90 as described above, when the ground potential is connected to the interlayer connection conductors 9521 to 9524, the second-class conductor pattern 94 improves the shielding performance.

Sixth Preferred Embodiment

Figure 14:
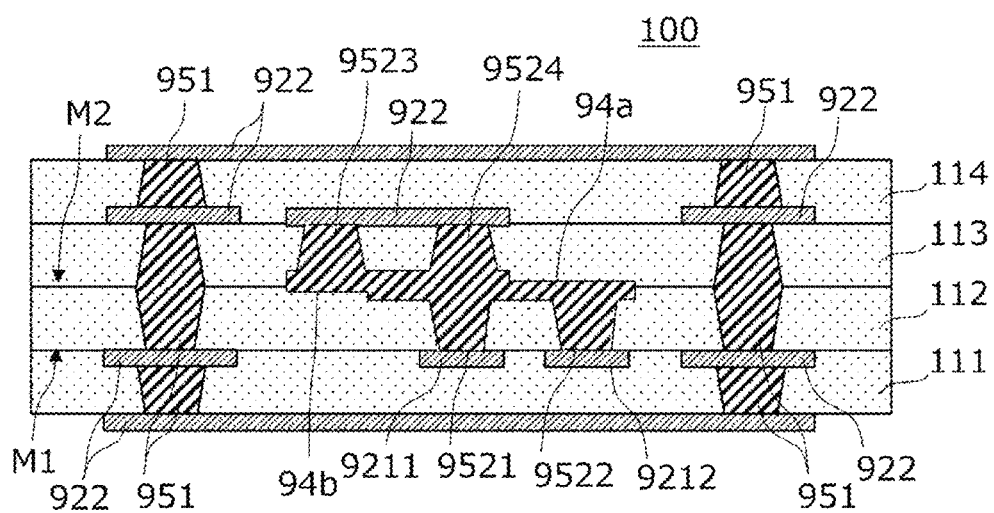
FIG. 14 is a sectional view of a multilayer board 100 according to a sixth preferred embodiment of the present invention.

In a sixth preferred embodiment, a multilayer board 100 further includes second-class conductor patterns 94a and 94b. FIG. 14 is a sectional view of the multilayer board 100 according to the sixth preferred embodiment.

The multilayer board 100 differs from the multilayer board 90 in that the second-class conductor pattern 94 is separated into the interlayer connection conductor 9521 and the second-class conductor pattern 9522, and the interlayer connection conductor 9521 shifts from the second-class conductor pattern 9522 in a direction orthogonal in the lamination direction. The other ends of the interlayer connection conductors 9521 and 9522 are connected to the second-class conductor pattern 94a formed on the other surface of the thermoplastic resin layer 112. One ends of the interlayer connection conductors 9521 and 9522 are connected to the first-class conductor patterns 9211 and 9212, respectively. The areas of the other ends of the interlayer connection conductors 9521 and 9522 are larger than the areas of one ends of the interlayer connection conductors 9521 and 9522.

One ends of the interlayer connection conductors 9523 and 9524 are connected to the second-class conductor pattern 94b formed on one surface of the thermoplastic resin layer 112. The other ends of the interlayer connection conductors 9523 and 9524 are connected to the first-class conductor patterns 922. The areas of one ends of the interlayer connection conductors 9523 and 9524 are larger than the areas of the other ends of the interlayer connection conductors 9523 and 9524.

However, the second-class conductor pattern 94b shifts from the second-class conductor pattern 94a in a direction orthogonal in the lamination direction. Accordingly, a step is formed at the boundary between the second-class conductor pattern 94a and the second-class conductor pattern 94b. The multilayer board 100 as described above has the same operation and effect as the multilayer board 90.

Seventh Preferred Embodiment

Figure 15:
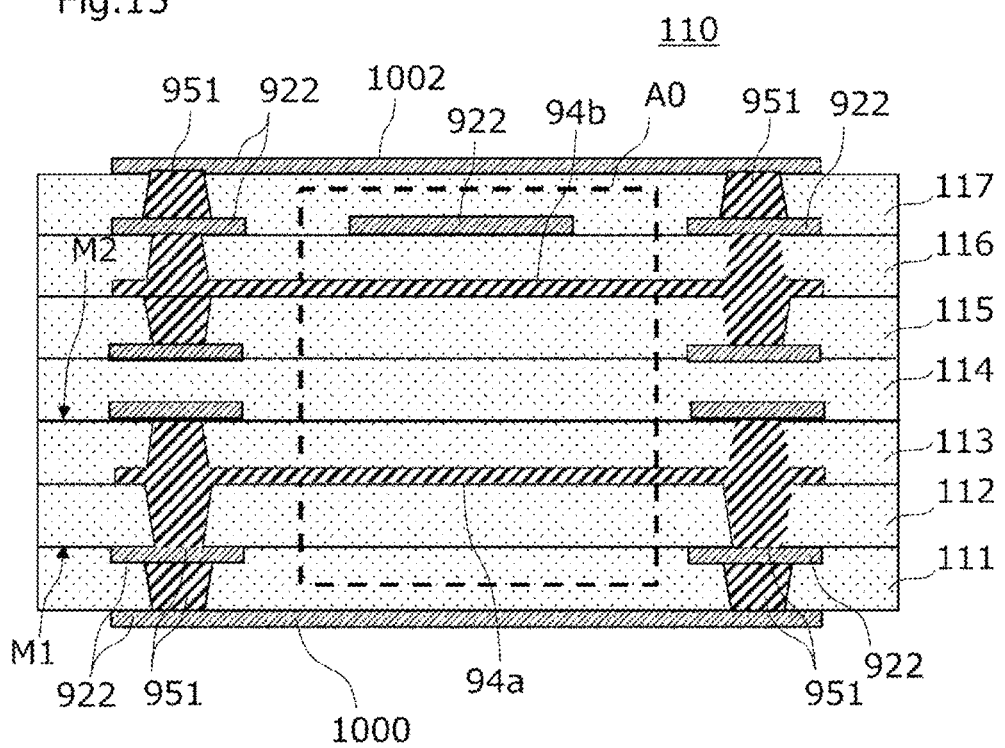
FIG. 15 is a sectional view of a multilayer board 110 according to a seventh preferred embodiment of the present invention.

In the seventh preferred embodiment, a shield region A0 is formed in a multilayer board 110. FIG. 15 is a sectional view of the multilayer board 110 according to the seventh preferred embodiment.

More specifically, the shield region A0 is located between a first-class conductor pattern 1000 provided on one surface of the multilayer board 110 and a first-class conductor pattern 1002 provided on the other surface of the multilayer board 110. The interlayer connection conductors 951 are provided on both sides in a direction orthogonal in the lamination direction of the shield region A0. The first-class conductor patterns 1000 and 1002 and the interlayer connection conductors 951 are connected to the ground potential. Therefore, the shield region A0 is surrounded by the first-class conductor patterns 1000 and 1002 and the interlayer connection conductors 951 connected to the ground potential.

Electronic circuits that should not be affected by noise are provided in the shield region A0 as described above. Such electronic circuits are, for example, high-frequency circuits, active elements, or integrated circuits (ICs).

It should be noted that, in the multilayer board 110, the interlayer connection conductors 951 may be connected to both ends of the second-class conductor pattern 94a from both sides in the lamination direction, or the interlayer connection conductors 951 may be connected to both ends of the second-class conductor pattern 94a from one side or the other side in the lamination direction. Furthermore, the interlayer connection conductors 951 may be connected to both ends of the second-class conductor pattern 94b from both sides in the lamination direction, or the interlayer connection conductors 951 may be connected to both ends of the second-class conductor pattern 94b from one side or the other side in the lamination direction.

It should be noted that a signal conductor layer may be provided in the shield region A0 as described above. Since the second-class conductor pattern 94a is present in a portion that leads to the end portions of the multilayer board 110, the radiation of noise to the outside of the multilayer board 110 can be reduced or prevented.

Eighth Preferred Embodiment

Figure 16:
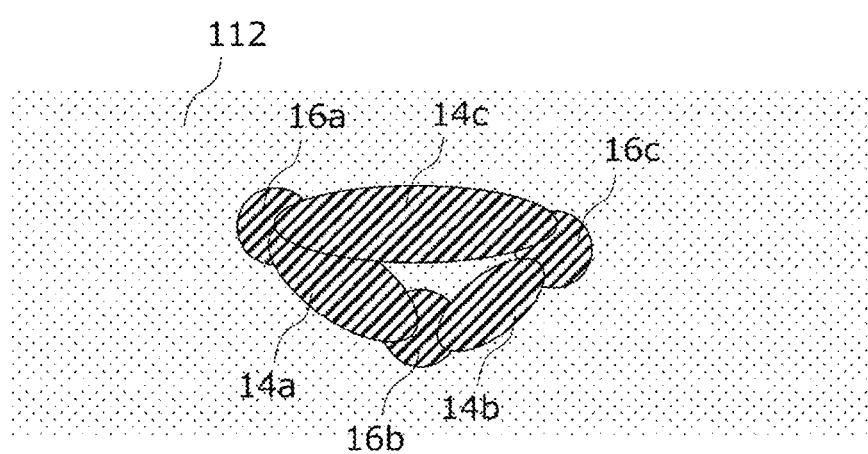
FIG. 16 is a plan view of interlayer connection conductors 16a to 16c and second-class conductor patterns 14a to 14c in a lamination direction.

In the eighth preferred embodiment, a multilayer board 120 includes interlayer connection conductors 16a to 16c and second-class conductor patterns 14a to 14c. FIG. 16 is a plan view of the interlayer connection conductors 16a to 16c and the second-class conductor patterns 14a to 14c in the lamination direction.

The interlayer connection conductors 16a to 16c pass through the thermoplastic resin layer 112 in the lamination direction. The second-class conductor patterns 14a to 14c are formed on the other surface of the thermoplastic resin layer 112. The second-class conductor patterns 14a to 14c connect the interlayer connection conductors 16a to 16c to each other. Specifically, the second-class conductor pattern 14a connects the interlayer connection conductor 16a (first interlayer connection conductor) and the interlayer connection conductor 16b (second interlayer connection conductor) to each other. The second-class conductor pattern 14b connects the interlayer connection conductor 16b (second interlayer connection conductor) and the interlayer connection conductor 16c (third interlayer connection conductor) to each other. The second-class conductor pattern 14c connects the interlayer connection conductor 16c (third interlayer connection conductor) and the interlayer connection conductor 16a (first interlayer connection conductor) to each other.

In the multilayer board 120 as described above, the proportion of the second-class conductor patterns 14a to 14c to the multilayer board 120 is large in the lamination direction. Therefore, when the second-class conductor patterns 14a to 14c are connected to the ground potential, the shielding performance of the multilayer board 120 improves.

In addition, the second-class conductor pattern 14a and second-class conductor pattern 14b are connected to each other. Therefore, when the second-class conductor pattern 14a and 14b are connected to the ground potential, the shielding performance of the multilayer board 120 further improves.

Ninth Preferred Embodiment

Figure 17:
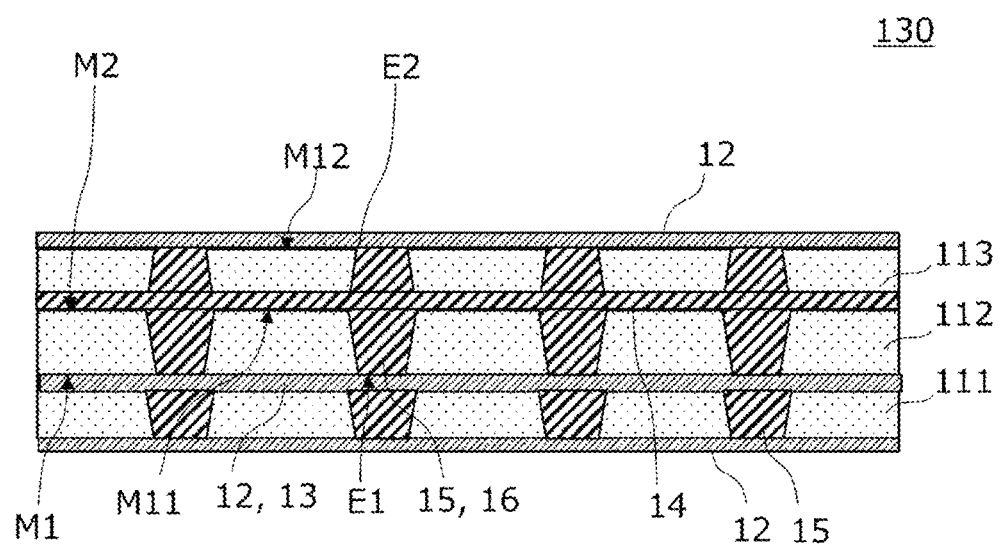
FIG. 17 is a sectional view of the multilayer board 110 according to the seventh preferred embodiment of the present invention.
Figure 18:
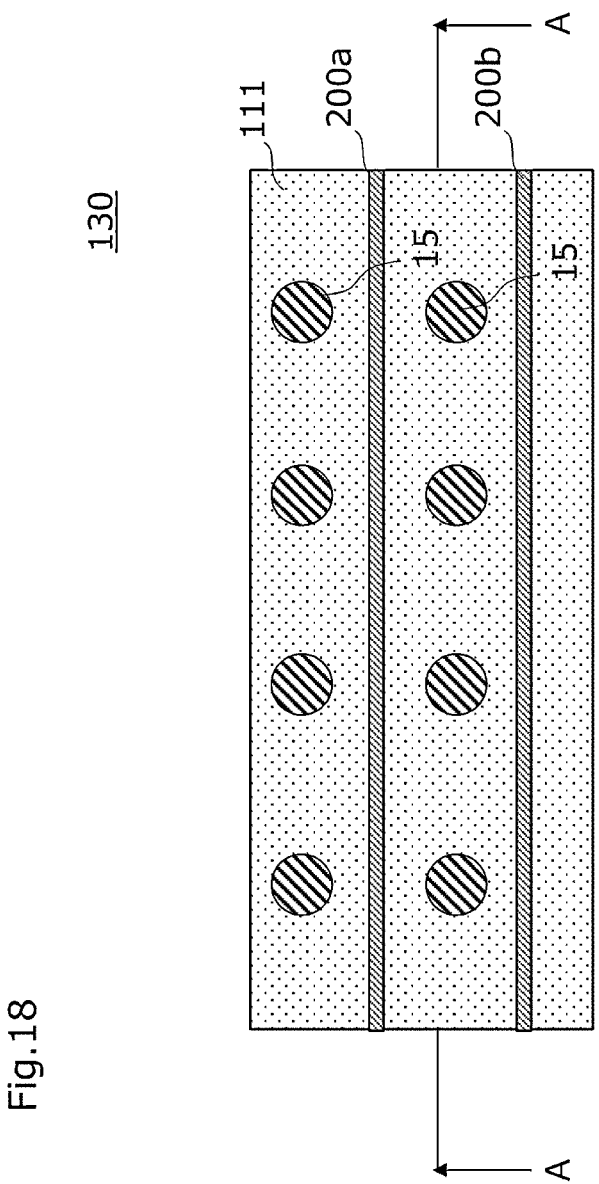
FIG. 18 is a top view of a thermoplastic resin layer 111.
Figure 19:
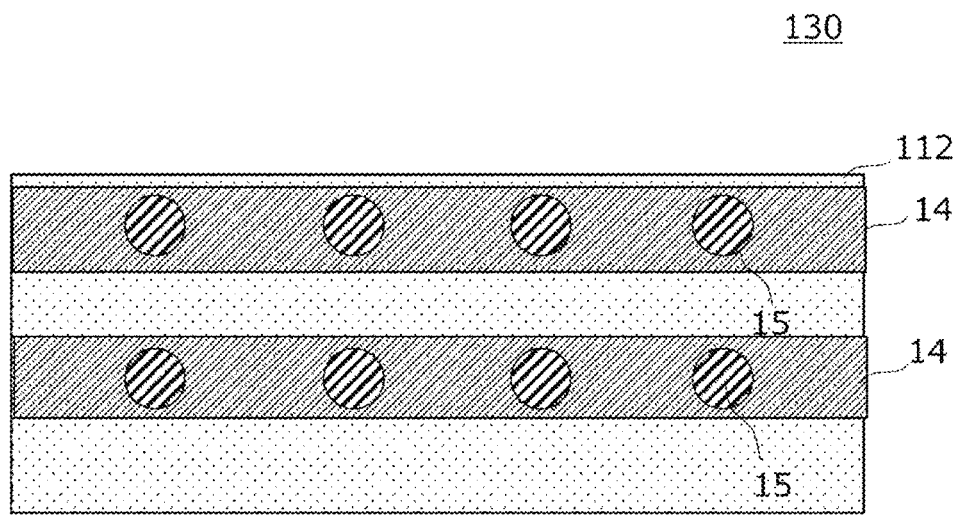
FIG. 19 is a top view of a thermoplastic resin layer 112.

In the ninth preferred embodiment, a multilayer board 130 has signal conductors 200a and 200b. FIG. 17 is a sectional view of the multilayer board 110 according to the seventh preferred embodiment. FIG. 18 is a top view of the thermoplastic resin layer 111. FIG. 19 is a top view of the thermoplastic resin layer 112.

The signal conductors 200a and 200b are formed on the other surface of the thermoplastic resin layer 111. The plurality of interlayer connection conductors 15 are arranged between the signal conductor layers 200a and 200b along the signal conductor layers 200a and 200b. This improves the isolation of the signal conductor layers 200a and 200b.

In addition, the plurality of interlayer connection conductors 15 are connected to each other by the second-class conductor pattern 14 provided on the thermoplastic resin layer 112.

Tenth Preferred Embodiment

Figure 20:
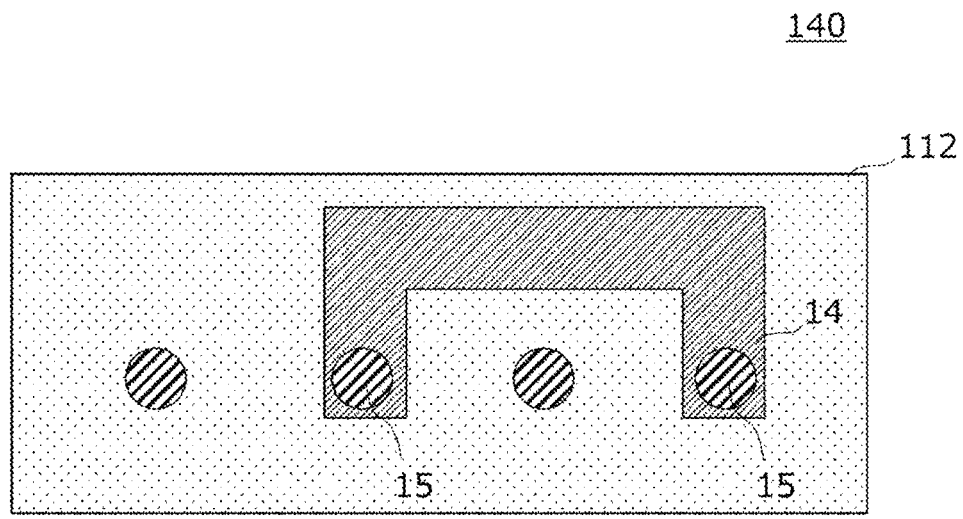
FIG. 20 is a top view of the thermoplastic resin layer 112.

In a multilayer board 140 according to the tenth preferred embodiment, two interlayer connection conductors 15 not adjacent to each other are connected to each other by the second-class conductor pattern 14. FIG. 20 is a top view of the thermoplastic resin layer 112.

As illustrated in FIG. 20, the interlayer connection conductor 15 not connected to the second-class conductor pattern 14 may be located between the two interlayer connection conductors 15 connected by the second-class conductor pattern 14.

As described above, the second-class conductor pattern can be used to achieve various electrical functions.

It should be noted that the second-class conductor pattern is not limited to a pattern that has functionality and may be a pattern that only makes electrical connection.

It should be noted that a diffusion layer may be formed between the first-class conductor pattern and the interlayer connection conductor. The diffusion layer is an alloy region formed by diffusion of metal in the first-class conductor pattern into the interlayer connection conductor and/or diffusion of metal in the interlayer connection conductor into the first-class conductor pattern.

It should be noted that the first-class conductor pattern may include an anticorrosive layer. The anticorrosive layer contains, for example, Ni and W. The anticorrosive layer is provided, for example, on the surface of copper foil, which is an example of the metal foil. It should be noted that the anticorrosive layer present on the bottom surface of the hole may be completely removed. Alternatively, a portion of the anticorrosive layer on the bottom surface of the hole may remain. When the anticorrosive layer is completely removed, the first-class conductor pattern and the interlayer connection conductor are connected with greater certainty.

It should be noted that the second-class conductor pattern only needs be disposed between the first signal conductor and the second signal conductor. Accordingly, the second-class conductor pattern may be disposed between the first signal conductor and the second signal conductor in the lamination direction or may be disposed between the first signal conductor and the second signal conductor in a direction orthogonal in the lamination direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer board comprising:
 a plurality of thermoplastic resin layers laminated together and including a first thermoplastic resin layer and a second thermoplastic resin layer;
 a first-class conductor pattern including a conductor foil on a first surface of the first thermoplastic resin layer;
 a second-class conductor pattern in contact with a second surface of the first thermoplastic resin layer and a first surface of the second thermoplastic resin layer;
 a first interlayer connection conductor located in the first thermoplastic resin layer and including a first end surface connected to the first-class conductor pattern and a second end surface connected to the second-class conductor pattern;

another first-class conductor pattern including a conductor foil on a second surface of the second thermoplastic resin layer;

a fourth interlayer connection conductor located in the first thermoplastic resin layer; and a fifth interlayer connection conductor located in the second thermoplastic resin layer; wherein the first surface of the second thermoplastic resin layer is in contact with the second surface of the first thermoplastic resin layer;

a conductor pattern including a conductor foil is not present at a boundary between the second surface of the first thermoplastic resin and the first surface of the second thermoplastic resin;

a conductor pattern including a conductor foil is not present at a boundary between the second-class conductor pattern and the second surface of the first thermoplastic resin layer;

a conductor pattern including a conductor foil is not present at a boundary between the second-class conductor pattern and the first surface of the second thermoplastic resin layer;

each of the second-class conductor pattern, the first interlayer connection conductor, the fourth interlayer connection conductor, and the fifth interlayer connection conductor includes a conductor of a single material including a resin or a conductor of a single material including a metal with a melting point lower than that of the conductor foil;

one end of the fourth interlayer connection conductor is connected to the first-class conductor pattern;

another end of the fourth interlayer connection conductor is connected to one end of the fifth interlayer connection conductor; and another end of the fifth interlayer connection conductor is connected to the another first-class conductor pattern.

2. The multilayer board according to claim 1, wherein an area of the second end surface is larger than an area of the first end surface.

3. The multilayer board according to claim 1, wherein a side surface of the second-class conductor pattern is in contact with the first thermoplastic resin layer.

4. The multilayer board according to claim 3, wherein the first thermoplastic resin layer includes a recess portion extending along the second-class conductor pattern and accommodating the second-class conductor pattern.

5. The multilayer board according to claim 4, wherein a roughness of a bottom surface and a side surface of the recess portion is larger than a roughness of a portion of the second surface of the first thermoplastic resin layer in which the recess portion is not located.

6. The multilayer board according to claim 1, wherein the second-class conductor pattern is a conductor pattern for an inductor.

7. The multilayer board according to claim 1, wherein the second-class conductor pattern is a conductor pattern for a capacitor.

8. The multilayer board according to claim 1, further comprising:

a second interlayer connection conductor in the first thermoplastic resin layer; wherein the second-class conductor pattern connects the first interlayer connection conductor and the second interlayer connection conductor to each other, and the second-class conductor pattern and the second interlayer connection conductor include the conductor of the single material.

9. The multilayer board according to claim 8, wherein the first interlayer connection conductor and the second interlayer connection conductor are adjacent to each other.

10. The multilayer board according to claim 8, further comprising:

a third interlayer connection conductor in the first thermoplastic resin layer; wherein the second-class conductor pattern connects the first interlayer connection conductor, the second interlayer connection conductor, and the third interlayer connection conductor to each other.

11. The multilayer board according to claim 1, further comprising:

a first signal conductor and a second signal conductor including a conductor foil; wherein the second-class conductor pattern is between the first signal conductor and the second signal conductor and defines a shield conductor.

12. The multilayer board according to claim 11, wherein the second-class conductor pattern is between the first signal conductor and the second signal conductor in a lamination direction in which the plurality of thermoplastic resin layers are laminated together.

13. The multilayer board according to claim 11, wherein the second-class conductor pattern is between the first signal conductor and the second signal conductor in a direction orthogonal in a lamination direction in which the plurality of thermoplastic resin layers are laminated together.

* * * * *